United States Patent [19]

Marquardt et al.

[11] Patent Number: 5,650,906

[45] Date of Patent: Jul. 22, 1997

[54] CIRCUIT ARRANGEMENT FOR PROTECTING POWER SEMICONDUCTOR SWITCHES WHICH CAN BE SWITCHED ON AND OFF AGAINST OVERVOLTAGES

[75] Inventors: Rainer Marquardt; Udo Seidl, both of Herzogenaurach, Germany

[73] Assignee: Siemens Aktiengesellschaft, Munich, Germany

[21] Appl. No.: 525,677

[22] PCT Filed: Mar. 24, 1993

[86] PCT No.: PCT/DE93/00270

§ 371 Date: Sep. 25, 1995

§ 102(e) Date: Sep. 25, 1995

[87] PCT Pub. No.: WO94/23497

PCT Pub. Date: Oct. 13, 1994

[51] Int. Cl.[6] .................................................. H02H 3/14
[52] U.S. Cl. .......................... 361/88; 361/18; 361/111; 361/91
[58] Field of Search ........................ 361/18, 111, 91, 361/88, 56, 55; 323/276

[56] References Cited

FOREIGN PATENT DOCUMENTS

| 0 311 576 | 4/1989 | European Pat. Off. . |
| 0 499 921 | 8/1992 | European Pat. Off. . |
| 40 37 348 | 2/1992 | Germany . |

OTHER PUBLICATIONS

IEEE Journal of Solid–State Circuits, vol. 25, No. 3, Jun. 1990, New York, US, pp. 677–682, Schoofs et al.: *A 700–V Interface IC for Power Bridge circuits*.

etz vol. 110 (1989) No. 10, pp. 464–471, Werner Bösterling et al.: *IGBT–Module in Stromrichtern:regeln, steuern, schützen*.

Bull. ASE/ucs 77 (1986) No. 16, 23 Aug. 1986, pp. B–388–B391, A. Gahleitner et al.: *Motorsteuerung für Elektrofahrzeuge mit MOSFET–Leistunsgelektronik*.

U. Tietze, Ch. Schenk: *Halbleiter–Schaltungs–technik*, 6th Edition, Spring–Verlag, Berlin, DE, 1983, pp. 66–76.

*Primary Examiner*—Jeffrey A. Gaffin
*Assistant Examiner*—Sally Medley
*Attorney, Agent, or Firm*—Kenyon & Kenyon

[57] ABSTRACT

A circuit arrangement protects power semiconductor switches against switching overvoltages. The switches can be switched on and off via their control input and form a pair of arms in a power converter. The circuit arrangement includes a comparator which has a downstream analog amplifier with a limiting characteristic curve and is connected in an electrically conductive fashion on the output side to a control input of the power semiconductor switch to be protected, an actual voltage and a predetermined desired voltage of the main terminal of this power semiconductor switch being present across the comparator. The result is a circuit arrangement for protecting against overvoltages, it being possible to dispense with an RCD wiring network for the power semiconductor switches, since very small voltage deviations are detected immediately and the power semiconductor switch is switched off in a controlled fashion.

6 Claims, 2 Drawing Sheets

CIRCUIT ARRANGEMENT FOR PROTECTING POWER SEMICONDUCTOR SWITCHES WHICH CAN BE SWITCHED ON AND OFF AGAINST OVERVOLTAGES

BACKGROUND OF THE INVENTION

The invention relates to a circuit arrangement for protecting against switching overvoltages power semiconductor switches which can be switched on and off via their control input and form a pair of arms in a power converter.

During switching operations in power converters, inductances in the power section of power converters cause overvoltages which can lead to damage to the power semiconductors, depending on their level and duration. Above all, the relatively quickly switching insulated gate bipolar transistor (IGBT) modules are themselves endangered in this case. In order to protect against such overvoltages, it is advantageous firstly to minimize the parasitic inductances in the main circuit by means of favorable conductor routing. Various wiring networks are then used and connected on the shortest path. These networks have the task of guaranteeing the operation in the permitted operating range, as well as occasionally reducing the switch-off power loss. An individual RCD circuit has been used for many years to protect power semiconductors and is also suitable for IGBT modules, for example. The arrangement consists of a capacitor which is connected in series with a diode with a parallel resistor. If, for example, at a relatively high pulse frequency the power loss converted into heat at the resistor assumes substantial values, this is something which is fundamentally undesirable. More frequently, use is made of more cost-effective measures (compare etz, Volume 110 (1989), pages 464–471) such as RCD voltage limiters for pairs of arms (FIG. 6b) or the summation circuit on the DC side (FIG. 6d), which moreover cause less power loss. In return, however, the latter are also not quite so effective. RCD voltage-limiting circuits are frequently also referred to as voltage-clamping circuits.

The aim of voltage-clamping circuits is to limit the overvoltage which is produced upon switching power semiconductor switches (denoted by PSC below) owing to inductances which are mostly determined by design, to a value which is safe for the PSC.

If only the known (RCD) wiring network is used as "voltage-clamping circuit" for the purpose of voltage limitation, it is to be dimensioned for the highest possible switch-off current. If, however, it is also desired to utilize the ability of modern PSCs, which can even switch off short-circuit currents which can reach more than ten times the periodically permitted current, the circuit capacitor is to be of an appropriately large dimension for the short-circuit case. It must be taken into account on so doing that the energy stored in the design inductor increases with the square of the switch-off current. A large circuit not only means a larger outlay on components and thus higher costs, but, moreover, there is also an increase in losses produced in the RCD circuit. In the case of high switching frequencies ($f_s$=10 kHz), relatively large power losses are to be dissipated via the circuit resistor. Not only does this complicate the design technology, there is also an increase in the outlay on cooling; and the efficiency of the circuit drops not inconsiderably.

If use is made of a voltage-clamping circuit by means of a zener diode between a main terminal (collector, drain) and the control terminal (gate, base) of a power MOSFET (Bull. ASE/UCS 77 (1986) 16, 23rd August, pages B388–B391), the zener voltage of the zener diode is dimensioned at the maximum permissible peak voltage in the circuit.

If the voltage peak caused by the design inductor is higher than the zener voltage, a (low) current can flow via the zener diode to the control terminal of the power semiconductor switch (for example power MOSFET, IGBT) and turn the latter on. However, this happens ideally only to a certain degree, with the result that the power semiconductor switch is driven just so far that the voltage across a main path (C-E or D-S or C-S, depending on component type) continues to correspond exactly to the zener voltage until the flow of current in the main path is terminated and the design inductor has completely given up the stored energy to the semiconductor switch. A voltage-clamping circuit operating by means of a zener diode between a main terminal and the control terminal of a power semiconductor switch has the following disadvantages:

—owing to the manufacturing tolerances and the temperature coefficient of the zener diodes, the voltage limitation is very imprecise (approximately ±5% manufacture plus approximately 10% additional error for a temperature range of 100 K.), —the power loss of the zener diode is so large that the function of this voltage limitation can generally be used only for rare cases of fault and not at the envisaged switching rate in continuous pulsed operation, and therefore —there is a need for additional circuits of the power transistors in order to limit the voltages during operation, which are known to cause a large and undesired power loss in the circuit resistors (loss-free wiring networks require an even higher outlay).

SUMMARY OF THE INVENTION

The present invention specifies a circuit arrangement for protecting power semiconductor switches, which can be switched on and off via a control input, in power converters, the aim being to avoid the abovementioned disadvantages.

According to the present invention, the circuit arrangement comprises a comparator which has a downstream analog amplifier with a limiting characteristic curve and is connected in an electrically conductive fashion on the output side to a control input of the power semiconductor switch to be protected, an actual voltage and a predetermined desired voltage of the main terminal of this power semiconductor switch being present across the comparator.

Owing to the configuration of this circuit arrangement, it is possible to dispense with a RCD wiring network for a power semiconductor switch, since very small voltage deviations at the main terminal of a power semiconductor switch are detected immediately and the power semiconductor switch is switched off in a controlled fashion. The elimination of the RCD wiring network also eliminates its disadvantages. The result is a circuit for protecting against overvoltages which has reduced circuit losses while avoiding the circuit outlay.

In an advantageous embodiment of the circuit arrangement, there is provided as the comparator, which has a downstream analog amplifier, an analog differential amplifier of which one input is connected to the output of a voltage divider, and of which the other input is connected to a reference voltage source, the voltage divider being connected on the input side to the main terminal of a power semiconductor switch. The circuit arrangement becomes particularly simple and compact as a result of this configuration.

In a further advantageous embodiment, the resistor of the voltage divider, which is connected to the main terminal of a power semiconductor switch, is subdivided into a plurality of component resistors connected electrically in series. The adjustment of the measuring range and a good frequency response can be realized by means of this embodiment of the voltage divider.

In a particularly advantageous embodiment of the circuit arrangement, the latter is respectively a component of a drive device of a power semiconductor switch. As a result, scarcely any further space is required for the circuit arrangement, and it is possible, moreover, to use the analog amplifier to amplify the control signal, the control signal being fed to the input of the differential amplifier across which the actual voltage of the main terminal of a power semiconductor switch is present. It is possible to use this embodiment also to include the power gain of the circuit arrangement when dimensioning the drive device, the result being a reduction in the required gain of the output stages of a known drive device.

BRIEF DESCRIPTION OF THE DRAWINGS

Reference is made for the purpose of further explanation of the invention to the drawing, in which an embodiment of the circuit arrangement according to the invention for protecting power semiconductor switches against overvoltages is illustrated diagrammatically.

DETAILED DESCRIPTION

Figure 1:
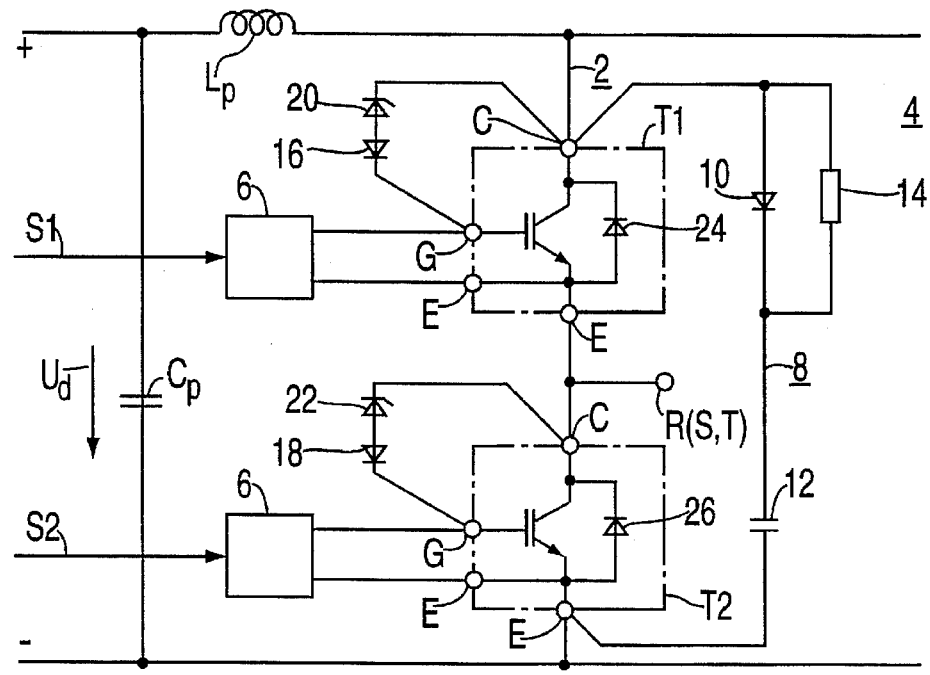
FIG. 1 illustrates a pair of arms of a known power converter.

Represented in FIG. I is a known power converter 4 with a pair 2 of arms which pair comprises two power semiconductor switches T1 and T2 which can be switched on and off. Power MOSFETs and insulated gate bipolar transistors (IGBTs) can be used as the power semiconductor switches T1 and T2. These power semiconductor switches T1 and T2 are driven via their respective gate-emitter terminals by means of a drive device 6 as a function of a control signal S1 and S2. Arranged as a common peak voltage limiter (group clamping circuit) at the output of each pair of arms is an RCD element 8 comprising a diode 10, a capacitor 12 and a resistor 14. The gate-collector Junction of each PSC module T1 or T2 is bridged by a diode 16 or 18 and a circuit zener diode 20 or 22. A further diode 24 or 26 is respectively connected to the PSC module T1 or T2 in an inverse-parallel fashion in the direction of the emitter-collector path of the PSC module T1 or T2, and serves as a return diode in invertor circuits having a voltage link. These freewheeling diodes 24, 26 can also be integrated in the module T1, T2 and are then termed reverse diodes.

When a PSC module T1 or T2 is switched off, the energy stored in the design inductor $L_p$ is dissipated to the clamping circuit of diode 10 and capacitor 12. The voltage across the circuit capacitor 12 corresponds in this case initially to the value of the link voltage $U_d$. On the basis of the energy dissipation of the design inductor $L_p$, the voltage across the circuit capacitor 12 increases to a maximum value which can theoretically be predetermined under ideal conditions. After dissipation of the energy of the design inductor $L_p$, the circuit capacitor 12 gives the quantity of energy absorbed via the circuit resistor 14 to the link capacitor $C_p$, with the result that the initial state of $U_{12}=Ua$ is restored after a few time constants.

The circuit zener diode 20 or 22 is dimensioned such that in a faultless switching operation the peak voltage produced across a circuit capacitor 12 is lower than the zener voltage, but that the zener voltage is reached in the event of an overcurrent. Specifically, if under the influence of the energy dissipation of the design inductor $L_p$ the voltage across the circuit capacitor 12 becomes higher than the zener voltage, the PSC module T1 or T2 is switched on via the zener diode 20 or 22 and can thus take over the further energy of the design inductor $L_p$, which in this case is converted into heat in the main path of the PSC module T1 or T2.

Figure 2:
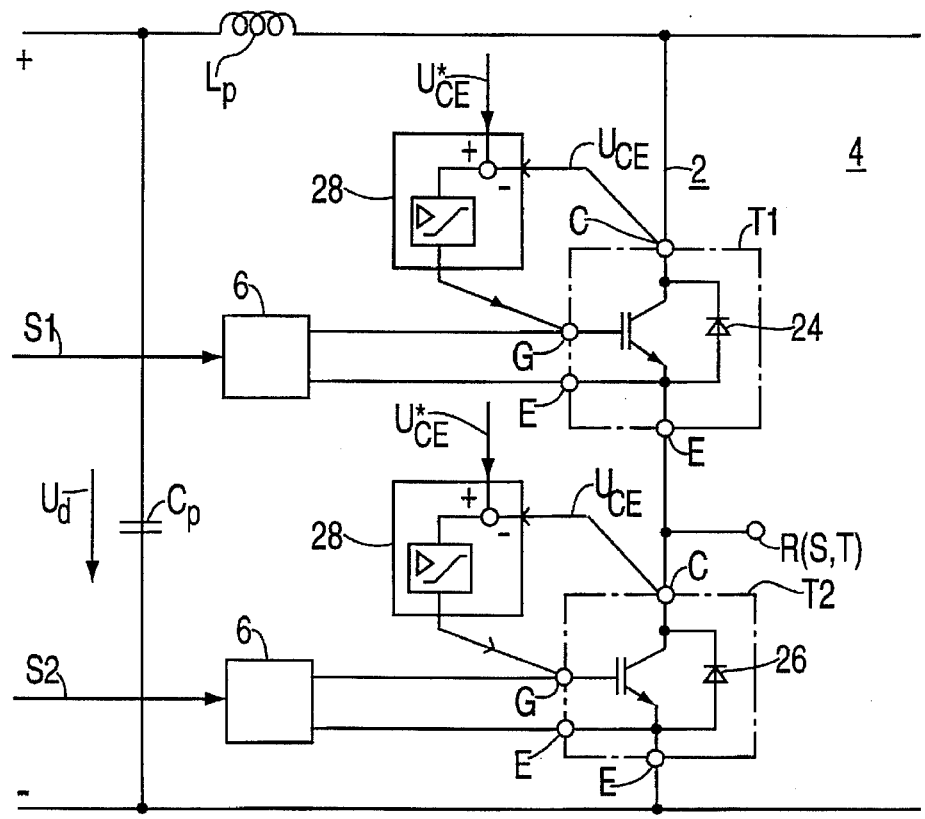
FIG. 2 illustrates a pair of arms of a power converter of which the power semiconductor switches are respectively provided with a circuit arrangement according to the present invention.

FIG. 2 represents a pair 2 of arms of a power converter 4 it being the case, however, that an RCD element 8 and the diodes 16, 18 and the zener diodes 20, 22 have been dispensed with. In return, each PSC module T1, T2 is provided with a circuit arrangement 28 according to the present invention for protecting the power semiconductor switches T1, T2 which can be switched off against switching overvoltages. This circuit arrangement 28 comprises a comparator downstream of which an analog amplifier with a limiting characteristic curve is connected. Present across the comparator are an actual voltage $U_{CE}$, on the one hand, and a desired voltage $U^*_{CE}$ of the main terminal C of the power semiconductor switch T1 or T2. The analog amplifier is connected in an electrically conductive fashion on the output side to the control input G of the PSC module T1 or T2. The more detailed design of the circuit arrangement 28 and the functioning thereof is described in more detail with the aid of a circuit realized in accordance with FIG. 3.

Figure 3:
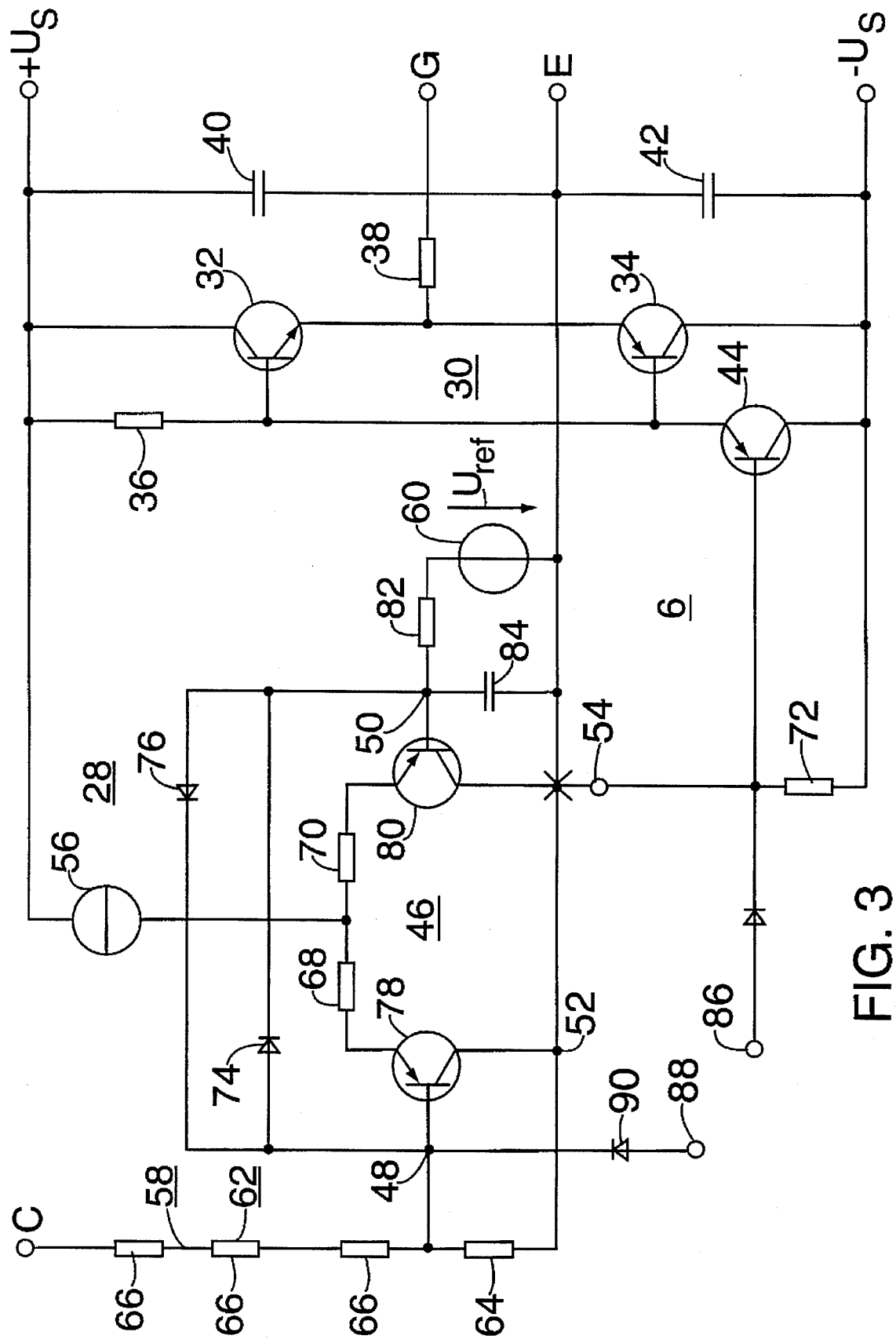
FIG. 3 illustrates a realization of the circuit arrangement according to the present invention, which is a component of a known drive device.

FIG. 3 represents the drive device 6 and the circuit arrangement 28 for protecting against switching overvoltages as a common component. The drive device 6 comprises a push-pull stage 30, comprising two transistors 32 and 34 and two resistors 36 and 38, two capacitors 40 and 42 and a signal amplifier 44. Present at the input of this signal amplifier 44 is a control signal S1 or S2 which, by means of this signal amplifier 44 and the push-pull stage 30, also termed driver stage, is fed to the control input G of a PSC module T1 or T2, the control signal S1 or S2 being converted into a control current required by the PSC module T1 or T2. The resistor 38, also termed the control circuit resistor, limits the level of the control current pulses occurring during switching on and off. The capacitors 40 and 42 are connected electrically in series, the connecting point being connected to an emitter terminal or collector terminal E of a PSC module T1 or T2 (reference potential of the circuit arrangement 28), a positive supply voltage $+U_S$ being connected to the free terminal of the capacitor 40 and a negative supply voltage $-U_S$ being connected to the free terminal of the capacitor 42. The potentials of the supply voltages $+U_S$ and $-U_S$ are determined by the required gate voltages of the PSC modules T1 and T2 to be controlled, and are typically +15 V and −15 V. This known drive device 6, or further embodiments, are to be found in the article entitled "IGBT-Module in Stromrichtern: regeln, steuern, schützen" ["IGBT modules in power convertors: regulating, controlling, protecting"], by W. Bösterling, R. Jörke and M. Tscharn, printed in "etz", Volume 110 (1989), Issue 10, pages 464–471, in particular the section entitled "Treiberstufen f ür Ein- und Ausschalten" ["driver stages for switching on and off"].

The circuit arrangement 28 for protecting against overvoltages, which comprises a comparator and an analog amplifier with a limiting characteristic curve, is formed here in the realized embodiment by an analog differential amplifier 46. According to the textbook "Halbleiter-Schaltungstechnik" ["semiconductor circuit engineering"] by U. Tietze and Ch. Schenk, 1983, pages 66–76, the differential amplifier 46 is a symmetrical DC amplifier having two inputs 48 and 50 and two outputs 52 and 54, one output 52 being connected in an electrically conductive fashion to the reference potential of the circuit arrangement 28 and the other output 54 being connected in an electrically conductive fashion to the input of the signal amplifier 44 of the drive device 6. Characteristic of the differential amplifier 46 is, inter alia, the constant-current source 56, which is connected on the input side to the positive supply voltage $+U_S$. The input 48 of the differential amplifier 46 is connected to an output of a voltage divider 58, and there is connected to the input 50 a reference voltage source 60 which is connected, furthermore, to the emitter terminal or collector terminal E (reference potential) of a PSC module T1 or T2. The actual voltage $U_{CE}$ of the PSC module T1 or T2 is measured by means of the voltage divider 58, which is connected in an electrically conductive fashion to the main terminal C, on the one hand, and to the emitter terminal E of a PSC module T1 or T2, on the other hand.

This voltage divider 58, which comprises a first and a second resistor 62 and 64, serves the purpose of adjusting the measuring range. The adjustment of the measuring range and a good frequency response can be realized by means of a suitable selection of the resistance values and a required division of the resistor 62 into a plurality of component resistors 66 connected electrically in series. The resistors 68, 70 and 72 permit the gain of the differential amplifier 46 to be adjusted in the linear portion of the characteristic curve. The diodes 74 and 76 permit avoiding overdriving of the transistors 78 and 80 of the analog differential amplifier 46, which would lead to time delays. The reference voltage $U_{ref}$ of the reference voltage source 60 determines the desired voltage $U^*_{CE}$ of the PSC module T1 or T2 in accordance with the following equation $$U^*_{CE}=(1+R1/R2)\cdot U_{ref}$$

R1 signifying the resistor 62 and R2 signifying the resistor 64 of the voltage divider 58. The resistor 82 serves to compensate the voltage drop owing to the base current of the transistors 78 and 80, which would otherwise lead to the deviation of the desired voltage $U^*_{CE}$. The capacitor 84 at the input 50 of the differential amplifier 46 is provided for the purpose of grounding the base of the transistor 80 with respect to radio frequencies.

The control signal S1 or S2 can be fed at various points of the drive device 6 with integrated circuit arrangement 28 for protecting against overvoltages. If the control signal S1 or S2 is applied to the control input 86 of the drive device 6, said control signal S1 or S2 is, as usual, converted into a control current pulse only by the drive device 6. If, by contrast, the control signal S1 or S2 is applied to the control input 88, which is connected by means of a decoupling diode 90 to one input 48 of the analog differential amplifier 46, the gain of the analog differential amplifier 46 is additionally used to amplify the driver stage 30 of the drive device 6. The gain of the driver stage 30 can be reduced for this reason, as a result of which the power loss is also reduced.

By using the circuit arrangement 28 according to the invention for protecting against overvoltages, there is no longer any need for additional wiring networks for the PSC modules T1 and T2 or for the pair 2 of arms of the power converter 4, with the result that there is a reduction in outlay and the spatial dimensions of a power converter 4 are reduced. If the circuit arrangement 28 is, in addition, further integrated into the drive device 6 of each PSC module T1, T2 and one input 48 of the differential amplifier 46 is co-used as control input, the power loss can be reduced by dividing the total gain between the driver stage 30 and the analog differential amplifier 46.

What is claimed is:

1. A circuit for protecting a power semiconductor switch against high-energy overvoltages, the power semiconductor switch having a control input and first and second main terminals, the control input controlling a current flow between the first and second main terminals, the circuit comprising:

a differential amplifier having first and second inputs and first and second outputs, the first output being coupled to the second main terminal of the power semiconductor switch and the second output being coupled to an input of a control device for controlling the power semiconductor switch, the differential amplifier further comprising a supply voltage terminal coupled to a positive supply voltage of the control device;

a voltage divider coupled between the first and second main terminals of the power semiconductor switch and having an output coupled to the first input of the differential amplifier; and a reference voltage source coupled to the second input of the differential amplifier.

2. The circuit of claim 1, wherein the control device has a limiting characteristic response.

3. The circuit of claim 1, wherein the first and second inputs of the differential amplifier are coupled together through first and second diodes.

4. The circuit of claim 1, wherein the voltage divider comprises a plurality of resistors, one of the plurality of resistors being connected to the first main terminal of the power semiconductor switch and being subdivided into a plurality of component resistors connected electrically in series.

5. The circuit of claim 1, wherein the second input of the differential amplifier is coupled through a capacitor to the second main terminal of the power semiconductor switch.

6. The circuit of claim 1, wherein the circuit and the control device are integrated together in an integrated circuit and wherein the first input of the differential amplifier is a control input of the integrated circuit.

* * * * *